(12) United States Patent
Topliss et al.

(10) Patent No.: US 7,227,296 B2
(45) Date of Patent: Jun. 5, 2007

(54) PROTECTIVE HOUSING FOR A CERAMIC ACTUATOR

(75) Inventors: Richard Topliss, Cambridge (GB); James Allan, Bury St. Edmunds (GB); Mark Richard Shepherd, Royston (GB)

(73) Assignee: 1...Limited, Cambridge (GB)

( * ) Notice: Subject to any disclaimer, the term of this patent is extended or adjusted under 35 U.S.C. 154(b) by 43 days.

(21) Appl. No.: 10/545,971

(22) PCT Filed: Feb. 25, 2004

(86) PCT No.: PCT/GB2004/000749

§ 371 (c)(1),
(2), (4) Date: Aug. 17, 2005

(87) PCT Pub. No.: WO2004/077497

PCT Pub. Date: Sep. 10, 2004

(65) Prior Publication Data

US 2006/0192461 A1    Aug. 31, 2006

(30) Foreign Application Priority Data

Feb. 26, 2003 (GB) ................... 0304467.4
Jul. 1, 2003 (GB) ................... 0315273.3
Sep. 13, 2003 (GB) ................... 0321499.6

(51) Int. Cl.
H01L 41/053 (2006.01)
(52) U.S. Cl. ...................... 310/348; 310/367
(58) Field of Classification Search ................ 310/348, 310/367, 324, 330–332
See application file for complete search history.

(56) References Cited

U.S. PATENT DOCUMENTS

| 4,549,799 | A | 10/1985 | Inagaki | |
|---|---|---|---|---|
| 4,625,137 | A | 11/1986 | Tomono | |
| 5,068,567 | A | 11/1991 | Jones | |
| 6,024,340 | A | 2/2000 | Lazarus et al. | |
| 6,541,897 | B2 * | 4/2003 | Endoh | 310/344 |
| 6,713,944 | B2 * | 3/2004 | Omata et al. | 310/328 |
| 6,812,622 | B2 * | 11/2004 | Matsuyama et al. | 310/344 |
| 7,068,930 | B2 * | 6/2006 | McKevitt et al. | 396/79 |
| 2001/0022488 | A1 | 9/2001 | Kawauchi et al. | |

FOREIGN PATENT DOCUMENTS

| EP | 0 730 312 | 9/1996 |
|---|---|---|
| GB | 2 376 795 | 12/2002 |
| JP | 3-261908 | 11/1991 |
| JP | 11-289112 | 10/1999 |
| WO | 01/47041 | 6/2001 |
| WO | 02/103451 | 12/2002 |
| WO | 03/048831 | 6/2003 |

OTHER PUBLICATIONS

International Search Report for PCT/GB2004/000749 dated Oct. 13, 2004.
Pearce et al., *On piezoelectric super-helix actuators*, Sensors and Actuators A 100, 2002, pp. 281-286.

* cited by examiner

Primary Examiner—Darren Schuberg
Assistant Examiner—Derek Rosenau
(74) Attorney, Agent, or Firm—Nixon & Vanderhye, PC

(57) ABSTRACT

An example housing that protects a ceramic actuator from excessive and damaging displacement comprises a protective structure arranged to limit the motion of the actuator by contacting at least one section of the actuator between fixed and moving terminals of said actuator. A suspension system for a lens holder of a miniature camera actuated by a ceramic actuator comprises four pivotally connected link elements in form of a parallelogram connected between a housing and the lens holder.

12 Claims, 10 Drawing Sheets

PROTECTIVE HOUSING FOR A CERAMIC ACTUATOR

This application is the US national phase of international application PCT/GB2004/000749 filed 25 Feb. 2004 which designated the U.S. and claims benefit of GB 0304467.4 filed 26 Feb. 2003, GB 0315273.3 filed 1 Jul. 2003, and GB 0321499.6 filed 13 Sep. 2003, the entire contents of each of which are hereby incorporated by reference.

BACKGROUND AND SUMMARY

This invention relates to actuators in particular ceramic actuators which may be electro-active, for example piezoelectric. In one aspect, this invention relates to a housing for such actuators which may be applied to a camera in which the actuator moves a lens holder. In another aspect, this invention relates to a suspension for a camera in which the actuator moves a lens holder. Both aspects may be applied to micro-cameras in portable data processing or communicating devices.

Piezoelectric and other electro-active benders made from ceramic base material such as lead zirconate titanate (PZT) are used in many applications. They are manufactured for example from multilayer (green) material and sintered at high temperatures into their final shape.

A variety of configurations for such actuators are known. Comparably large translation displacements have been recently achieved by using a structure of piezoelectric bender tape extending helically around an axis which is itself curved, as described, for example, in WO-0147041 or D. H. Pearce et al., Sensors and Actuators A 100 (2002), 281-286. Such devices are capable of exhibiting displacement in the order of millimetres on an active length of the order of centimetres.

Whilst the manufacturing of ceramic actuators is known, their applicability is limited due to the brittleness of the material they are made of. It would therefore be desirable to provide housing for ceramic actuators that reduces the sensitivity of ceramic actuators against sudden impacts as caused for example by a drop onto a hard surface.

As a separate matter, in recent years, with the explosive spread of portable information terminals called PDAs and portable telephones, an increasing number of products incorporate a compact digital camera or digital video unit employing a CCD (charge-coupled device) or CMOS (complementary metal-oxide semiconductor) sensor as an image sensor. When such a digital camera or the like is miniaturized using an image sensor with a relatively small effective image-sensing surface area, its optical system also needs to be miniaturized accordingly.

To achieve focussing or zooming, additional drive motors have to be included in the already confined volume of such miniature cameras. Whilst most of the existing cameras rely on variations of the well-known electric-coil motor, a number of other actuators have been proposed as small drive units for the lens system. These novel drive units often include actuators of electro-active material, for example piezoelectric, piezoresistive, electrostrictive or magnetostrictive material, typically ceramic actuators.

Small electro-active actuators with comparably large translation displacements have been recently build using a structure of piezoelectric bender tape extending helically around an axis which is itself curved, as described, for example, in WO-01/47041 or D. H. Pearce et al., Sensors and Actuators A 100 (2002), 281-286. Such devices are capable of exhibiting displacement in the order of millimetres on an active length of the order of centimetres. They may be manufactured from multilayer ceramic base material such as lead zirconate titanate (PZT) and sintered at high temperatures into their final shape. The use of such actuators as drive motors for lens systems has been proposed in WO-02/103451.

As drive units adapt to the reduced volume of the compact camera designs, lens suspensions systems, which constrain the motion of the lens holder, have to co-evolve. Lens suspension systems suitable for miniaturized cameras, particularly for cameras driven by an electro-active transducer ideally have a low stiffness, resistive force or friction in direction of the desired motion and high stiffness in all other directions.

According to a first aspect of the invention, there is provided a housing for a ceramic actuator including a protective structure, preferably with compliant elements contacting the actuator, limiting the the range of motion of sections of the bender located distant from both fixed and moving terminals of the bender.

An actuator is typically operated with a fixed terminal or end section and a moving terminal or end section. The fixed terminal is attached to the housing or mounted on a base structure shared with the housing. The moving terminal of the actuator is the section of the actuator that displays the largest displacement relative to the fixed section of the actuator. It is seen as an important feature of the first aspect of the invention that the protective structure is adapted to limit the range of displacement of the actuator by contacting the actuator at one or more sections located between the two terminal sections of the actuator. Thus, the actuator is free to move, on actuation, within the range of displacement until it contacts the protective structure and references to contacting should be understood accordingly. Such a protective structure protects the actuator against a sudden impact, as caused for example by a drop onto a hard surface, by preventing excessive displacement of the actuator which would cause damage.

The actuator may be a linear actuator having a moving end section that describes a near linear motion.

Advantageously, the protective structure is placed outside the nominal range of displacement. The nominal range of displacement of the actuator is the displacement exhibited by the actuator during normal operating conditions. The limits of the nominal range of displacement define a surface or an envelope outside which the protective structure is located.

Advantageously, the protective structure follows the contour defined by the limits of the nominal range of displacement. For example, the protective structure may be arranged to have an approximately constant distance from the limits of the nominal range of displacement at different points along the actuator.

In one type of embodiment the protective structure includes one, two or more discrete elements adapted to contact the actuator, for example resilient members such as mechanical spring type structures for removal of energy from the actuator on impact. Suitable structures include for example resilient beams disposed along the protective structure.

In another type of embodiment the protective structure includes a continuous surface adapted to contact a section extending along the actuator.

Desirably, the portions of protective structure adapted to contact the actuator are compliant, for example by being resilient or by being formed by compliant material, so as to be capable of absorbing the kinetic energy of the actuator.

The protective housing of the invention may be readily manufactured for example by moulding of plastic materials. The protective structure may be advantageously moulded in one piece with the housing. The compliant layer, if provided, may be attached for example by glueing to the protective structure. Alternatively, the compliant layer or layers may be incorporated in the housing during manufacture by two-shot moulding, in which the housing and compliant layers are produced in different materials within the same mould. Resilient structures such as resilient beams may be advantageously moulded in one piece with the housing, forming the appropriate ramp contour. Alternatively, spring structures may be cut from thin metal sheet, for example by photo-chemical etching, bent to the appropriate shape if necessary, and then fixed into the housing, preferably by means of moulded locating pips in the housing.

The present invention is particularly advantageous used to house actuators capable of relatively large displacement, such as the actuators of the type mentioned above and disclosed in WO-0147041 or D. H. Pearce et al., Sensors and Actuators A 100 (2002), 281-286, because such actuators are particularly susceptable to damage from a sudden impact.

According to a second aspect of the invention, there is provided a camera including a support structure; a lens holder holding at least one lens; a suspension for mounting said lens holder on the support structure; and an actuator for moving said lens holder, wherein the suspension includes two link elements each pivotally connected to the support structure at one end and pivotally connected to the lens holder at the other end.

Such a suspension has a low stiffness, resistive force or friction in the direction of the desired motion and high stiffness in all other directions. It is thus suitable for miniaturized cameras, particularly for cameras driven by an electro-active actuator.

The suspension system is preferably a type of a four-bar linkage, in which the suspension further includes a first attachment member to which the first end of each link element is pivotally connected and which is attached to the support structure, and a second attachment member to which the second end of each link element is pivotally connected and which is attached to the lens holder. Such a type of suspension system can be formed from one continuous piece of material, preferably a plastics material, for example selected for example from a group including polypropylene, polyethylene and polyamide (nylon). Advantageously, the thickness of the link element tapers towards the pivotally connected ends such that the link element is thicker in the middle than in the immediate vicinity of the pivots or hinges.

Advantageously, the pivotally connected ends of the suspension extend along the circumference of the lens holder.

Preferably, the pivotally connected ends of the suspension extend along a length which exceeds a tenth, more preferably a third or even a half, of the diameter of the lens holder. This provides the advantage that, as compared to a suspension where this length is shorter, the suspension can sustain a higher torsional force without significant deformation.

In a preferred embodiment the actuator extends around the lens holder leaving a single gap with the suspension located in said gap. In this embodiment, the suspension supports the lens holder at just one side or relative to a cylindrical lens holder within just one sector. The sector, measured by connecting the end points of the longest pivot that is located at the lens holder with the center of the lens holder, is preferably less than 90 degrees. As a result, the lens holder is suspended at a quarter or less of its circumference—excluding the suspension effected by the actuator.

In some variants of the invention it may advantageous to limit the amount of rotational motion around the pivoting ends to less that 20 degrees, because, as a result, the lens holder's motion is limited to the equivalent maximum displacement which improves the protection of the actuator.

BRIEF DESCRIPTION OF THE DRAWINGS

These and other aspects of inventions will be apparent from the following detailed description of non-limitative examples making reference to the following drawings.

In the drawings.

DETAILED DESCRIPTION OF EXAMPLE EMBODIMENTS

Figure 1A:
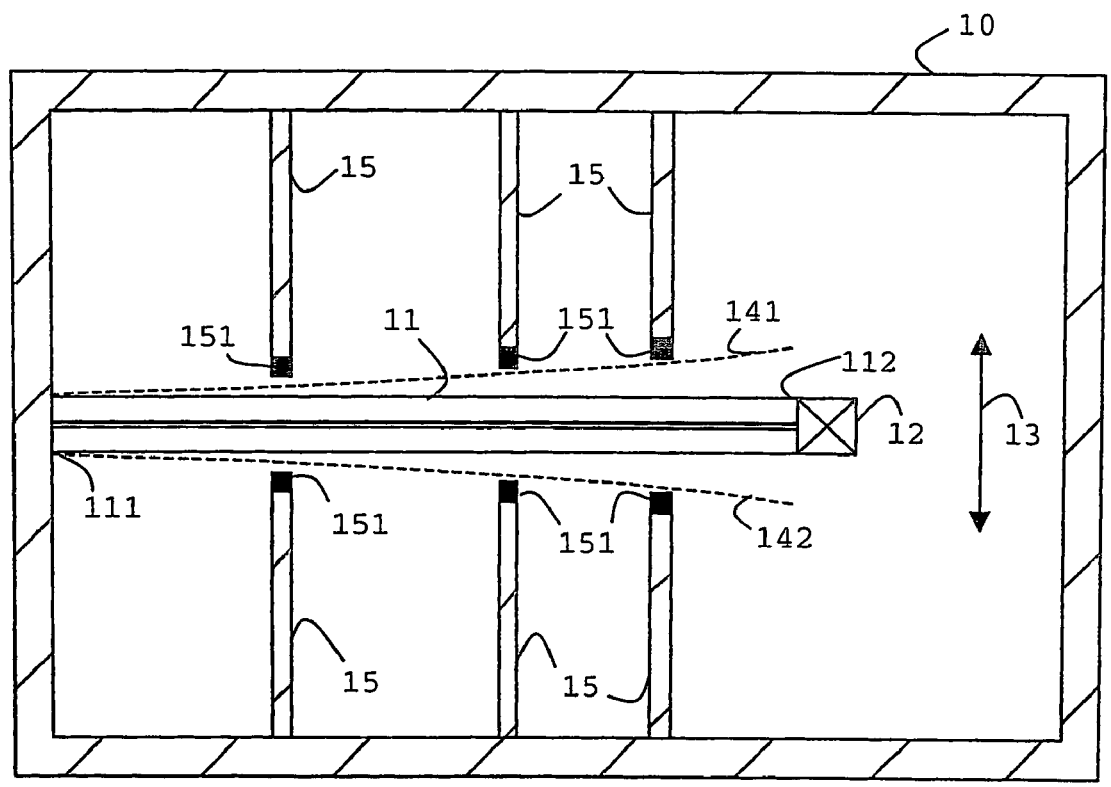
FIG. 1A is a schematic cross-section of a ceramic bender in a housing in accordance with an example of the present invention.

In FIG. 1A, there is shown a schematic vertical cross-section through a housing 10. Within the housing 10 there is mounted a layered piezoelectric bender 11 having a conventional structure comprising two layers of piezoelectric material with electrodes (not shown) which in use receive an activation voltage which causes a differential change in length of the two layers concomitant with bending of the bender 11. A first end 111 of the bender 11 is fixed to the housing. At the distal end 112 of the bender 11, a load 12 is attached to the bender 11. A double arrow 13 indicates the direction in which the distal end 112 of the bender 11 moves when the bender 11 is activated. The dashed lines 141, 142 indicate the upper and lower limits, respectively, of the nominal displacement of the bender 11, that is the displacement exhibited by the bender 11 during normal operating conditions.

A novel feature of the housing are six protective elements 15 which together form a protective structure for the bender 11. The elements 15 extend from the housing 10 to points close to the dashed lines 141,142 that indicate the limits of the nominal displacement. The elements 15 are posts or blades carrying a compliant foam layer 151 at locations facing the bender 11 that would first come into contact with the moving bender 11.

As the bender 11 in the housing 10 is subject to an impact force, the inertia of the combined mass of bender 11 and load may force the bender 11 to move beyond the nominal limits of displacement, thus precipitating cracks in the ceramic material of the bender 11. The support elements 15, however, are designed and placed such that the bender 11 contacts at least one of the elements before a damage to the ceramic material occurs. Kinetic energy stored in the bender 11 is then absorbed by the foam elements 151.

Figure 1B:
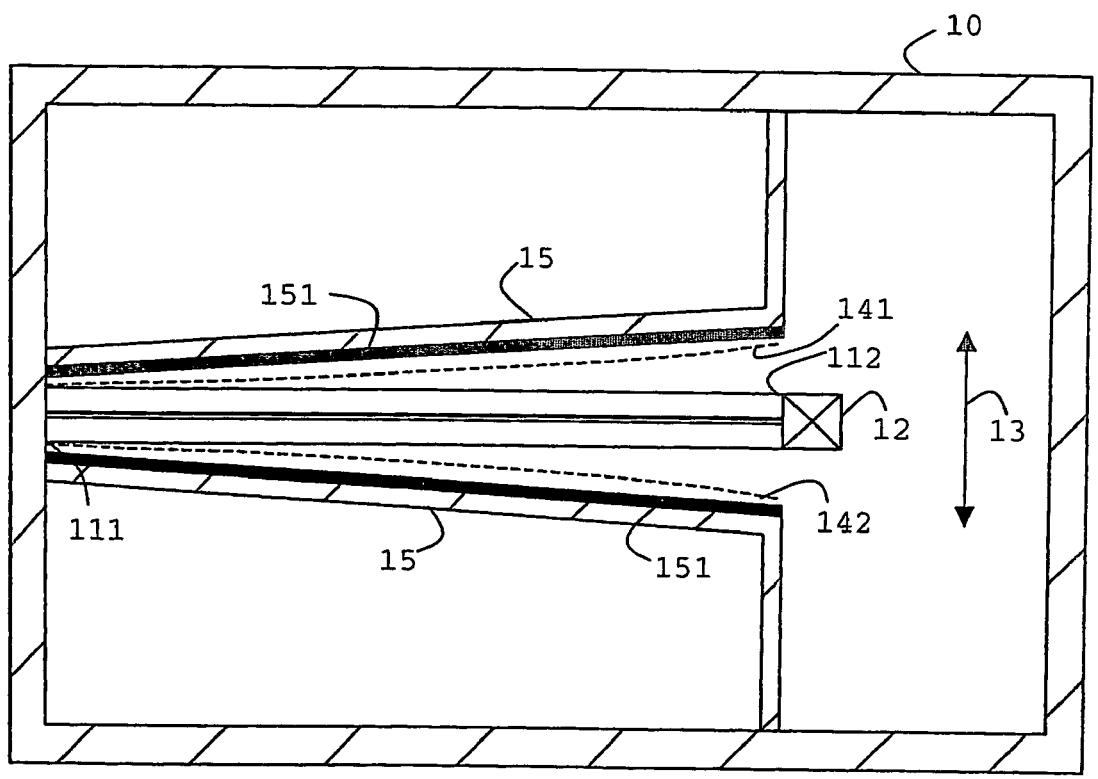
FIG. 1B is a schematic cross-section of a ceramic bender in a housing in accordance with another example of the present invention.

In FIG. 1B, there is shown a similar configuration to the one of FIG. 1A. In this variant, however, the protective structure 15 takes a different form and in particular is laterally extended to form a continuous surface contoured to follow approximately the nominal displacement envelope 141, 142. A foam layer 151 protects the bender 11 from the impact of a sudden contact with the protective structure 15, as in the example of FIG. 1A.

Figure 2A:
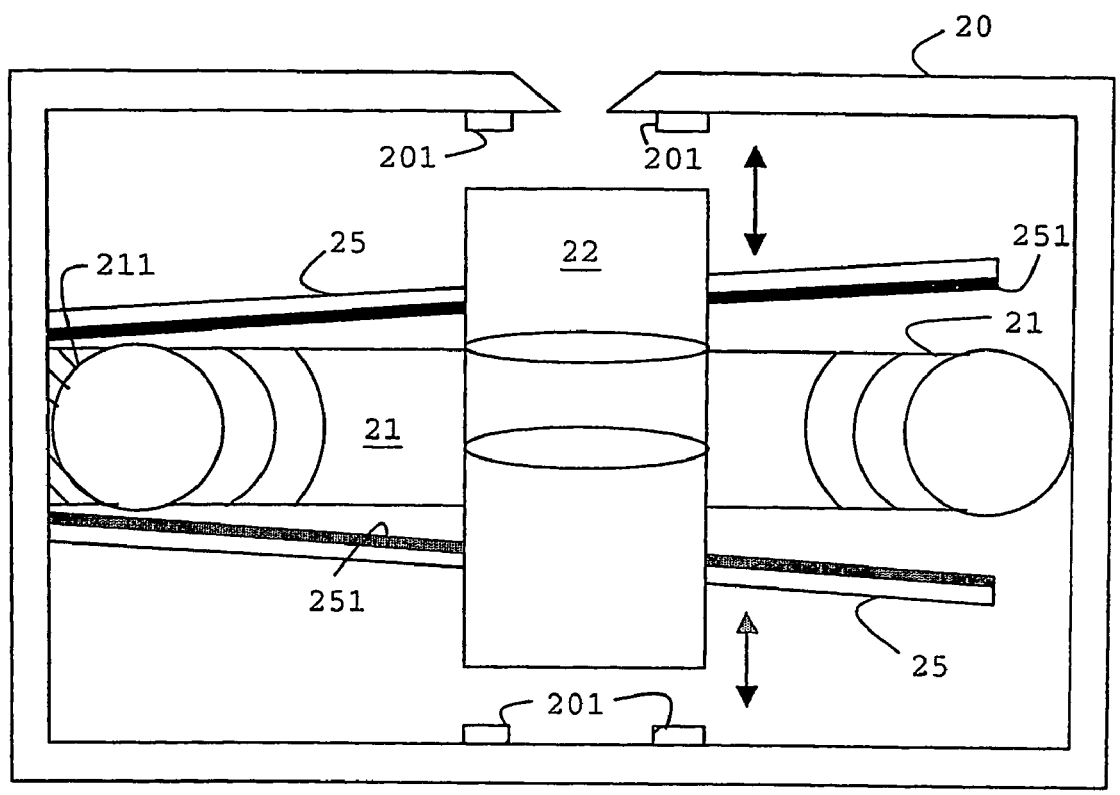
FIG. 2A is a schematic cross-section of a super-coiled bender carrying a lens system in a housing in accordance with an example of the present invention.
Figure 2B:
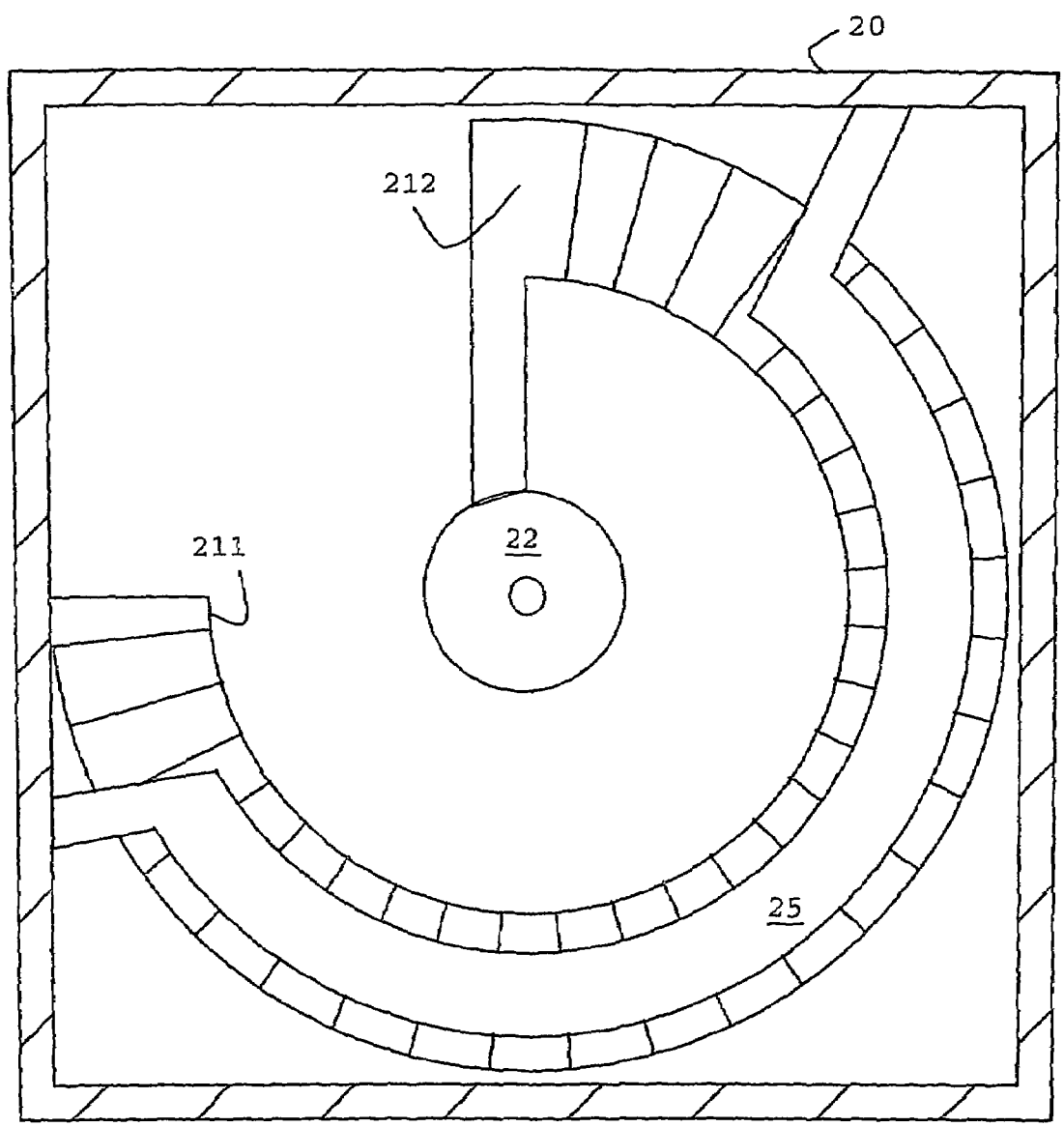
FIG. 2B is a schematic partial top view of a super-coiled bender carrying a lens system in a housing in accordance with an example of the present invention.

FIGS. 2A and 2B show a camera assembly having a protective housing 20, shown in both a vertical cross-section (FIG. 2A) and a horizontal cross-section (FIG. 2B).

In this example, the actuator 21 comprises a piezoelectric multi-layer, bender tape, for example of a bimorph construction, extending helically around an axis which is itself curved, as described, for example, in WO-01/47041 or D. H. Pearce et al., Sensors and Actuators A 100 (2002), 281-286 which are both incorporated herein by reference and the teachings of which may be applied to the present invention. In particular, the actuator 21 comprises a tape wound helically around a first axis, referred to as the minor axis. The helically wound portion is further coiled into a secondary winding of about three quarters of a complete turn. The axis of this secondary winding is referred to as the major axis. The first winding is known as the primary winding or primary helix. Although in this embodiment the secondary winding is about three-quarters of a complete turn, in general, the secondary winding could be any curve and could exceed one turn and form a spiral or secondary helix. It is therefore usually referred to as secondary curve. The tape is arranged on actuation to bend around the minor axis. Due to the helical curve around the minor axis, such bending is concomitant with twisting of the actuator 21 around the minor axis. Due to the curve around the major axis, such twisting is concomitant with relative displacement of the ends 211, 212 of the actuator 21.

The proximate end 211 of the actuator 21 is fixed to the housing 20. Onto its distal end 212 there is mounted a lens barrel 22 at the approximate center of the housing. Consequently, actuation of the actuator 21 drives movement of the lens barrel 22 relative to the housing 21. This type of lens suspension and actuations system are described in greater detail in WO-02/103451 and WO-03/048831, which are both incorporated herein by reference and the teachings of which may be applied to the present invention.

The housing of the present example includes a protective structure 25 in the form of two sloping surfaces or ramps arranged above and below the actuator 21 approximately following the contours of the upper and lower limits, respectively, of the nominal displacement of the actuator 21, that is the displacement exhibited by the actuator 21 during normal operating conditions, thereby limiting the motion of the actuator 21. This protective structure 25 is covered with foam layers 251 facing the actuator 21 so as to come into contact with the moving actuator 21.

The housing 20 has end stops 201 arranged to limit the motion of the lens barrel 22. Thus, with the occurrence of an impact, when the lens barrel 22 hits the end stops 201, the actuator 21 can be regarded as being momentarily fixed to the housing 20 at both ends. Between both now fixed ends 211,212, however, the remaining sections of the actuator 21 continue to move, thus potentially causing, in the absence of the protective structure 25, damage to its ceramic material. As however the actuator 21 with its middle section contacts the protective structure 25, the motion of the actuator 21 is limited and the kinetic energy of the actuator 21 is absorbed by the foam layer 251, so the risk of damage is consequently reduced.

The protective structure 25, 251 is shaped such that, in the event of an impact, the actuator 21 contacts approximately evenly along its length. In the example, it bends into half a turn above and below the secondary turn of the actuator 21. The contact surface 251 of the protective structure may be shaped convex to provide a broader area of contact with the outer circumference of the actuator. The advantage of a continuous or quasi-continuous support is shown by reference to the following table which, for the case of a protective structure of discrete elements, lists the length of actuator sections between the discrete elements (or in other words the relative separation between neighboring discrete elements) and the maximum stopping force that can be applied to the actuator section before causing damage to it.

| Length of unsupported sections between two supports (relative units) | Maximum Force (N) | Distance (mm) |
|---|---|---|
| 4 | 0.35 | 7.3 |
| 3 | 0.46 | 4.1 |
| 2 | 0.7 | 1.8 |
| 1 | 1.4 | 0.45 |

From the table, the stopping distance can be calculated. It is apparent from the table that closer points of contact, and in the limit continuous contact, is better to stop the actuator before it reaches its breaking point.

Figure 3:
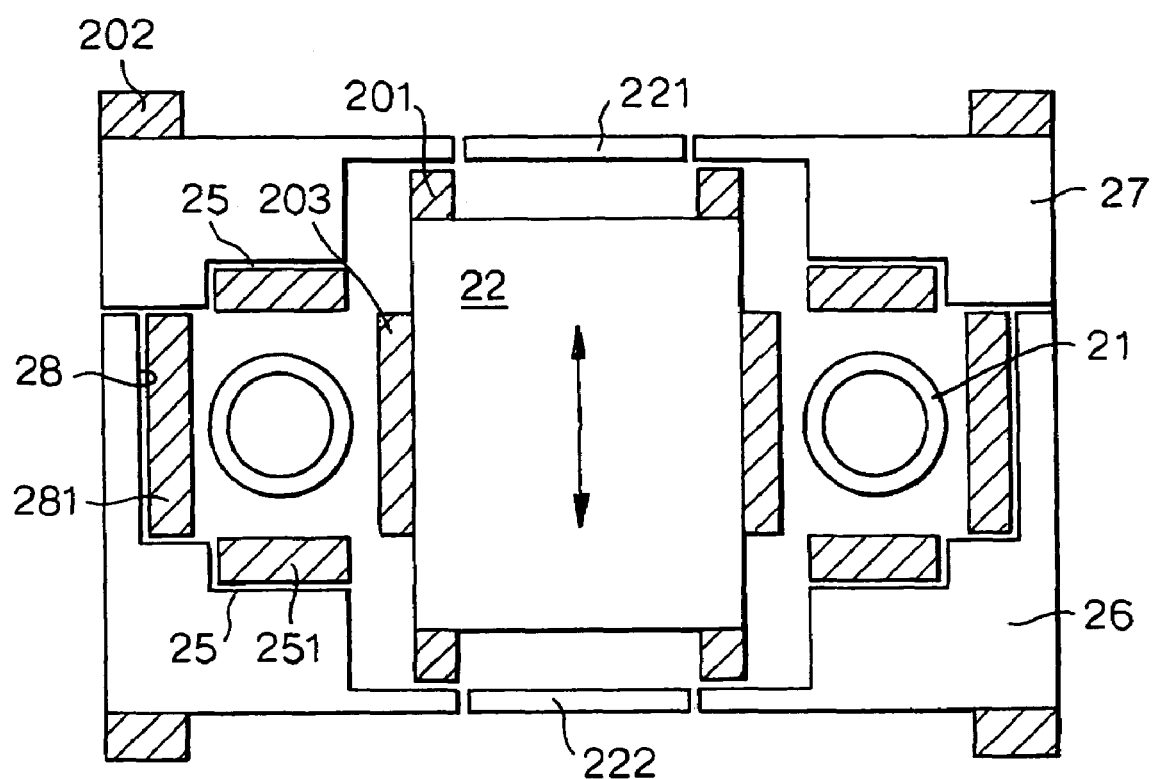
FIG. 3 is a schematic cross-section of a super-coiled bender carrying a lens system in a housing in accordance with an example of the present invention.

FIG. 3 shows a vertical cross-section of a further camera assembly in a protective housing. This camera assembly is similar to that of FIGS. 2A and 2B, so common elements are given the same reference numerals and a description thereof is not repeated. The camera assembly has an actuator 21 of the same type as in FIG. 2A. The actuator 21 is attached to a lens barrel 22 and to a housing (attachments not shown) which in this case comprises two parts, namely a bottom housing 26 and a top housing 27. A transparent cover 221 and image sensor 222 are shown above and below the lens barrel in the top and bottom housings 27,26 respectively. In the housing parts 26,27, a protective structure 25 takes the form of sloping surfaces or ramps which follow the actuator 21 from above and below and are faced with compliant material 251. Additional protection is provided at the inside of the bottom housing 28 in the form of compliant pads 281, to afford protection against sideways motion.

Each part 26, 27 of this housing may be manufactured by a two shot moulding process, in which the housing parts 26, 27, and the compliant material 251 and the compliant pads 28 are formed together in the same moulding process For example, the top housing 27 may be produced by first forming the compliant pads 251 by a first shot of resin into a suitable mould, and then forming the housing 27 on top of the pads 251 with a second shot of (different) resin. Similarly, the bottom housing 26 may be moulded in two shots, one for the compliant pads 251,281 and one for the more rigid housing structure 26.

FIG. 3 also shows further protection for the lens and actuator system, in the form of end stops 201 for the lens barrel, end stops 202 for the complete assembly, and a protective pad 203 around the lens barrel. These additional protective features may be moulded integrally with the housing or lens barrel elements, as above. The assembly of FIG. 3 provides comprehensive shock protection for its functional elements (actuator 21 and lens barrel 22) and can be readily and cheaply mass manufactured.

FIGS. 4 to 7 show perspective views of alternative protective structures which may be used in place of the protective structure 25 shown in FIGS. 2 and 3. In particular, the compliant foam layer 251 of FIGS. 2 and 3 is replaced by a plurality of discrete, resilient elements in the form of mechanical spring structures, serving to remove energy from the moving actuator on impact. FIGS. 4 to 7 show the lower protective structure, the upper protective structure being a mirror image thereof.

Figure 4:
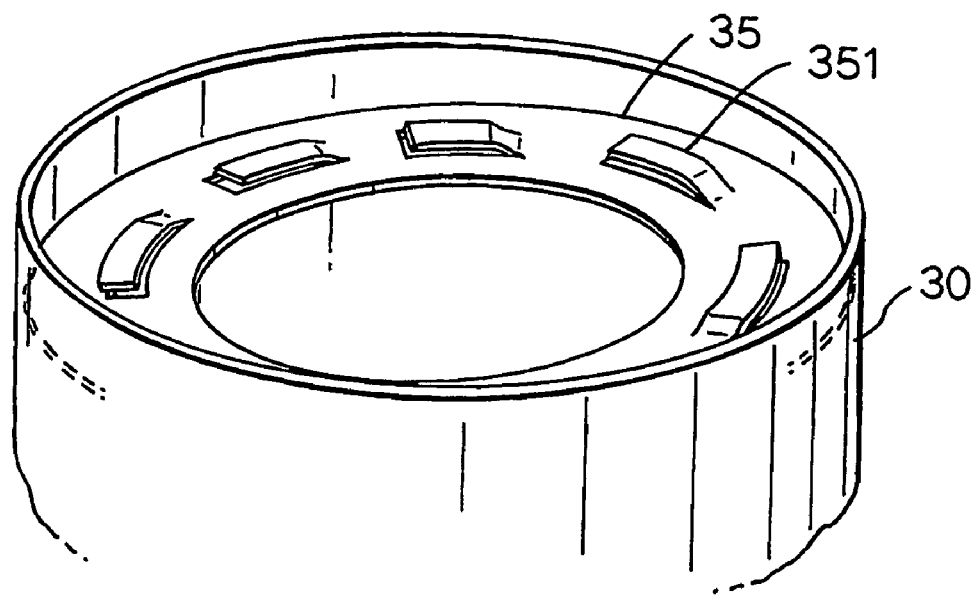
FIG. 4 is a schematic perspective view of a protective structure incorporating compliant beam protrusions in accordance with an example of the present invention.

FIG. 4 shows a partial perspective view of such a protective structure 35 incorporating a spring structure 351 within a housing 30, for protection of a ceramic actuator and lens barrel assembly (not shown) similar to those in FIG. 2. The spring structure follows the ramp contour already described and includes multiple compliant beam protrusions, to contact the actuator on impact and remove energy.

Figure 5:
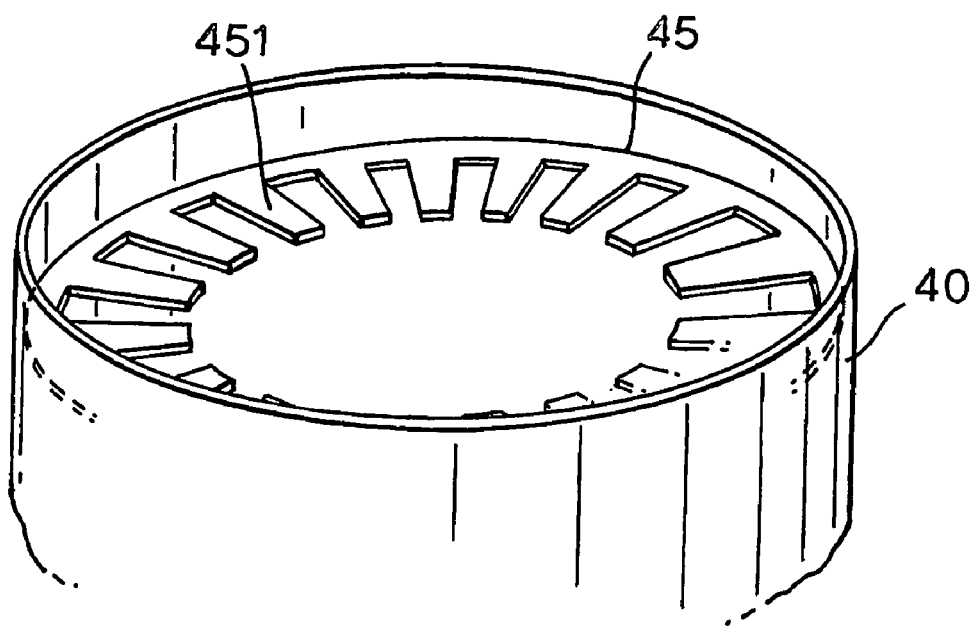
FIG. 5 is a schematic perspective view of a protective structure incorporating compliant fingers in accordance with an example of the present invention.
Figure 6:
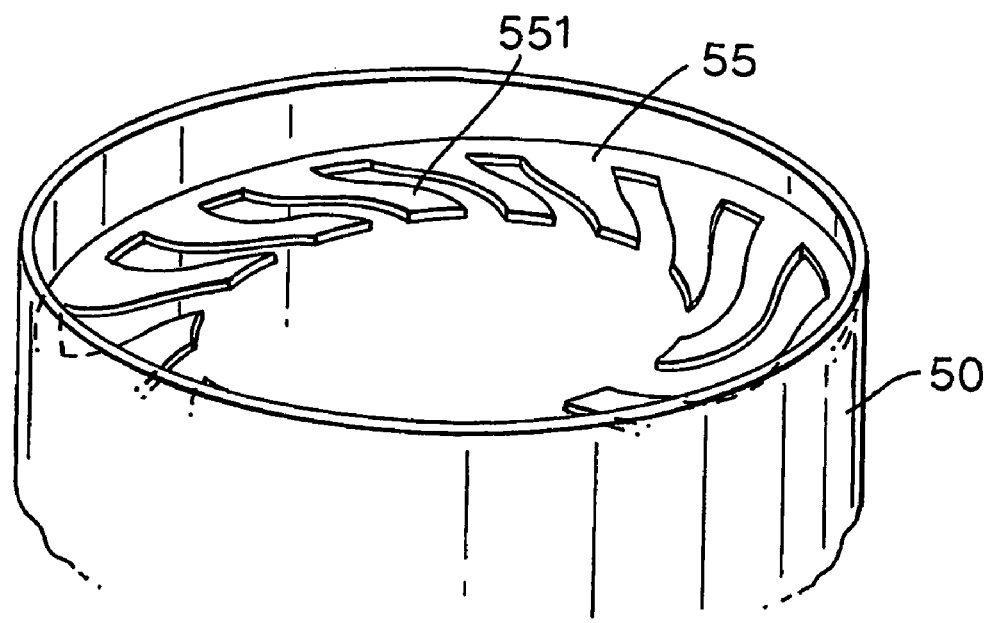
FIG. 6 is a schematic perspective view of a protective structure incorporating shaped compliant fingers in accordance with an example of the present invention.

FIG. 5 shows a partial perspective view of a further embodiment in which the spring structure 451 is a multitude of compliant beams or fingers, like a comb, along the ramp contour of the protective structure 45 within a housing 40. The fingers 451 repeat along the whole length of the protective structure 45 although only a small number of fingers 451 are shown in the drawing.

FIG. 5 shows a partial perspective view of a further embodiment in which the compliant beams or fingers of the spring structure 551 (on the protective structure 55 in the housing 50) are an 'S' shape. This shape allows allows the fingers to be longer than in the embodiment of FIG. 5.

Figure 7:
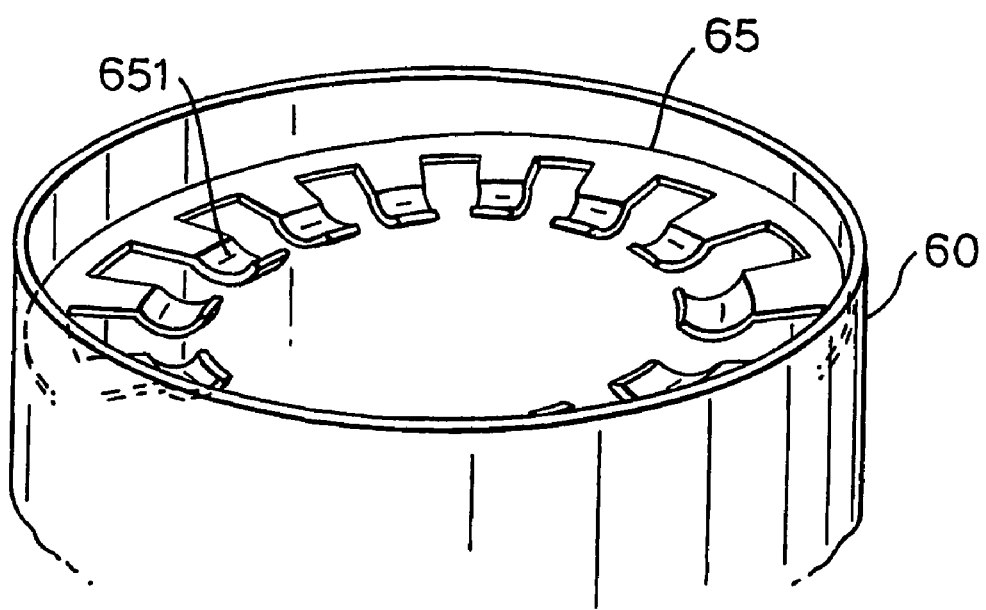
FIG. 7 is a schematic perspective view of a protective structure incorporating compliant cupped fingers in accordance with an example of the present invention.

FIG. 7 shows a partial perspective view of a further embodiment in which the compliant beams of the spring structure 651 are cupped such that when they contact the coiled ceramic actuator (not shown) the load is distributed over a greater area. The cups are designed to follow the curvature of the surface of the ceramic actuator. The cupped fingers 651 repeat along the length of the protective structure 65 within the housing 60; in the drawing only 3 of the cupped fingers are shown.

The embodiments shown in FIGS. 2 to 7 are examples of compliant structures and it will be apparent that other variations fall within the scope of the present invention.

Figure 8A:
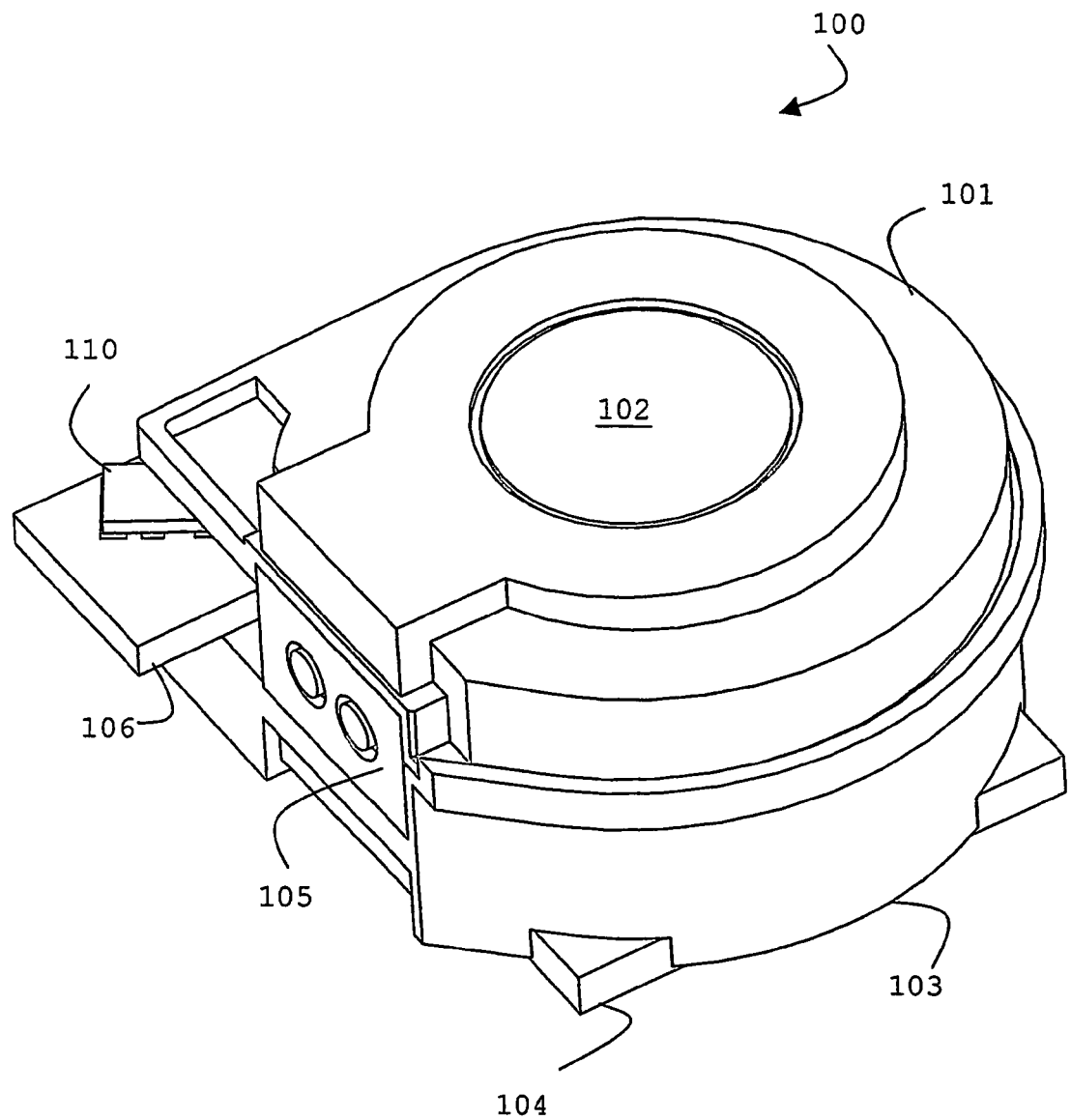
FIG. 8A is a perspective view on a camera housing.

In FIG. 8A, there is shown a camera housing 100 for a miniature camera. The housing 100 includes a top lid 101 with a central opening or aperture 102 for the passage of light from the exterior into the interior of the housing 100. The opening can be covered by an optical filter. The lower section of the housing 100 includes a bottom lid 103 and a base plate 104. The base plate carries the image sensor (not shown) which may be a CCD or CMOS device together with other circuits to capture the image and transmit it to other parts of the camera.

At one side of the housing 100 there is shown an anchor plate 105 which provides mounting points for a suspension system to be described below. Another plate 106 is used to mount the fixed end 111 of a piezoelectric actuator 110.

To further protect the camera and the actuator, the housing 100 may be cast into a block of suitable plastic material.

Figure 8B:
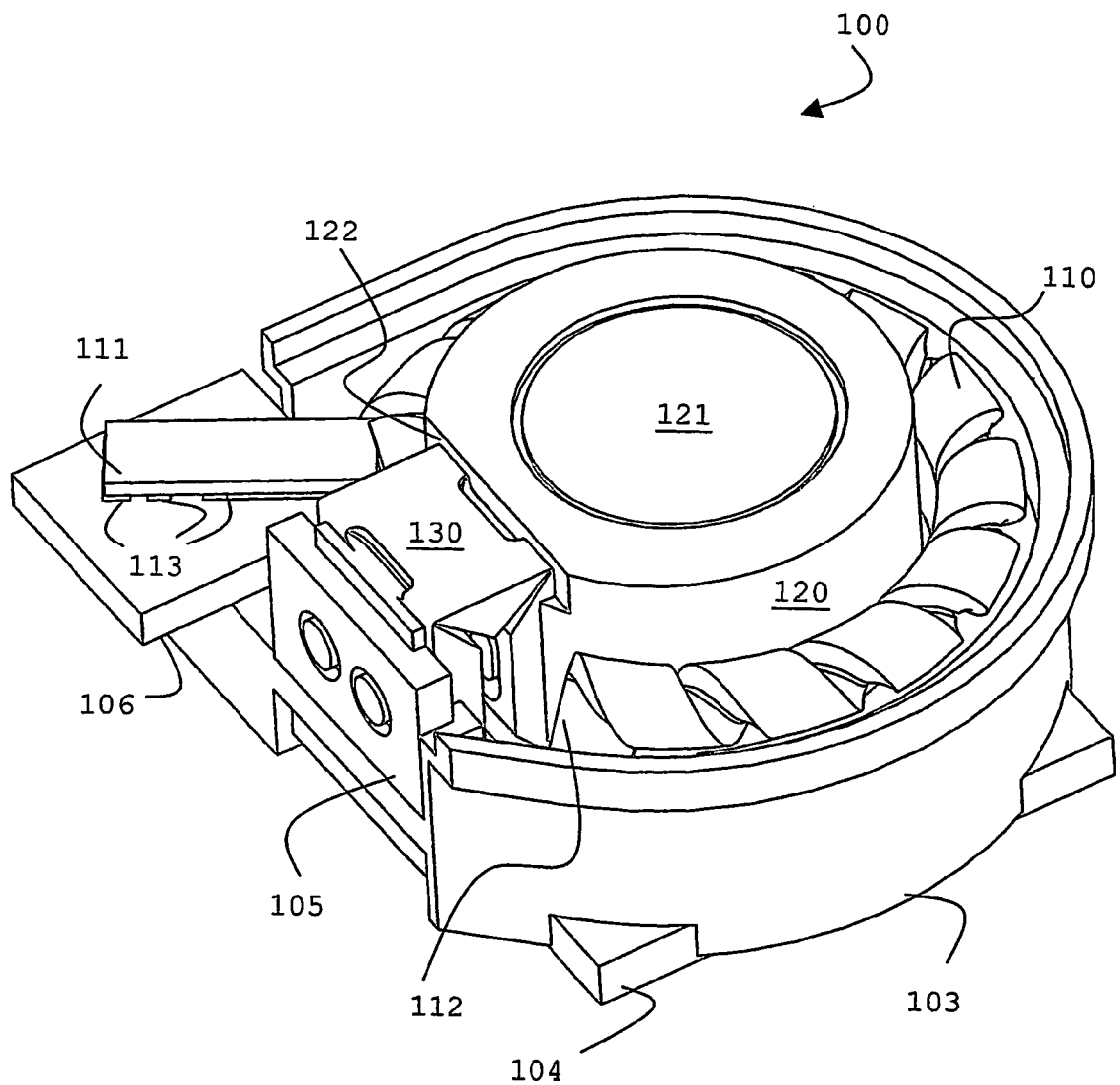
FIG. 8B is a perspective view on the camera housing of FIG. 8A with a top lid removed.

The housing 100 acts as a support structure for a lens holder 120 as follows. FIG. 8B shows the housing 100 with the top lid 101 removed thus exposing the lens holder (or barrel) 120 with a first upper lens 121 visible. The lens holder 120 has a nominally cylindrical shape that is flattened along one side 122 to provide a mounting surface for the suspension 130. The lens holder 120 is axially movable relative to the housing 100 to allow focusing.

The actuator 110 comprises a piezoelectric multi-layer, bender tape, for example of a bimorph construction, extending helically around an axis which is itself curved, as described, for example, in WO-01/47041 or D. H. Pearce et al., Sensors and Actuators A 100 (2002), 281-286 which are both incorporated herein by reference and the teachings of which may be applied to the present invention. In particular, the actuator 110 comprises a tape wound helically around a first axis, referred to as the minor axis. The helically wound portion is further coiled into a secondary winding of about three quarters of a complete turn. The axis of this secondary winding is referred to as the major axis. The first winding is known as the primary winding or primary helix. Although in this embodiment the secondary winding is about three-quarters of a complete turn, in general, the secondary winding could be any curve and could exceed one turn and form a spiral or secondary helix. It is therefore usually referred to as secondary curve. The tape is arranged on actuation to bend around the minor axis. Due to the helical curve around the minor axis, such bending is concomitant with twisting of the actuator 110 around the minor axis. Due to the curve around the major axis, such twisting is concomitant with relative displacement of the ends 111, 112 of the actuator 110.

The lens holder 120 is placed in the center of the actuator 110. The moving end 112 of the actuator 110 is attached to the lens holder 120 at a point or area at mid-height of the lens holder 120, i.e., close to its equator. Consequently, actuation of the actuator 110 drives movement of the lens holder 120 relative to the housing 100. This type of lens suspension and actuation system is described in greater detail in WO-02/103451, which is incorporated herein by reference and the teachings of which may be applied to the present invention.

The fixed end 111 of the actuator 110 extends into a flat portion which acts as a tab for connecting the actuator 110 to the housing 100. This tab has electrical contact pads 113 on the bottom face, soldered onto corresponding contact points on the board 106. Through these contacts external control signals or voltage levels are applied to the electrodes of the actuator 110.

The suspension 130 will now be described, with reference to FIG. 9A which is a cross-sectional view of the suspension 130.

The suspension 130 is a specific form of a four-bar linkage comprising four links pivotally connected together in the shape of a parallelogram as follows. The first link is a first attachment member 132 rigidly connected to the housing 101, 103. The second link is a second attachment member 134 rigidly connected to the lens holder 120. The remaining two links are two link elements 133, 135 which each extend, parallel to each other, between the first and second attachment members 132, 134 and are pivotally connected to the first and second attachment members 132, 134 as follows. The links 132-135 are integrally formed from a continuous piece of material. The thickness of the continuous piece of material forming each link 132-135 tapers towards the portions which connect each adjacent pair of links 132-135, such that the material is reduced to a thin bridge connecting the two adjacent links 132-135, whilst the middle section of each link 132-135 remains relatively stiff. As a consequence the suspension 130 and its links 132-135 offer small resistance against motion of the lens holder 120 in the desired (vertical) direction but much greater resistance against motion in other directions. The links 132-135 and, hence, the portions which connect each adjacent pair of links 132-135 have a width of about 4 mm and the nominal diameter of the lens holder 120 is 9.5 mm, thus effectively preventing a rotational or tilting movement of the barrel.

Each of the the portions which connect each adjacent pair of links 132-135 extends linearly in the direction of its axis of relative rotation along the circumference of the lens holder 120, thus providing resistance to torsional forces which otherwise could lead to a tilting of the suspended camera. The length of the portions which connect each adjacent pair of links 132-135 in the above example is approximately a third to half of the diameter of the lens holder.

In the example, the suspension 100 is preferably made from a single piece of polypropylene. Other suitable plastic materials include polyethylene or polyamide (nylon). Alternatively the bars of the suspension can be made from metals or metal alloys. The suspension can be cast or injection molded.

It will be appreciated that the lens holder 120 is suspended solely by means of the suspension 130 and the actuator 110. The system is free of further potential sources of friction such as guide rails or posts to reduce the potential amount of force the actuator has to provide. It was found that even though the suspension 130 connects to the lens holder 120 exclusively within a sector of less than 90 degrees, and both the actuator 110 and the suspension 130 are linked to the lens holder 120 within a sector of less than 120 degrees, the tilt of the lens holder 120 can be kept within the limits required to generate pictures in VGA or SVGA quality.

Figure 9A:
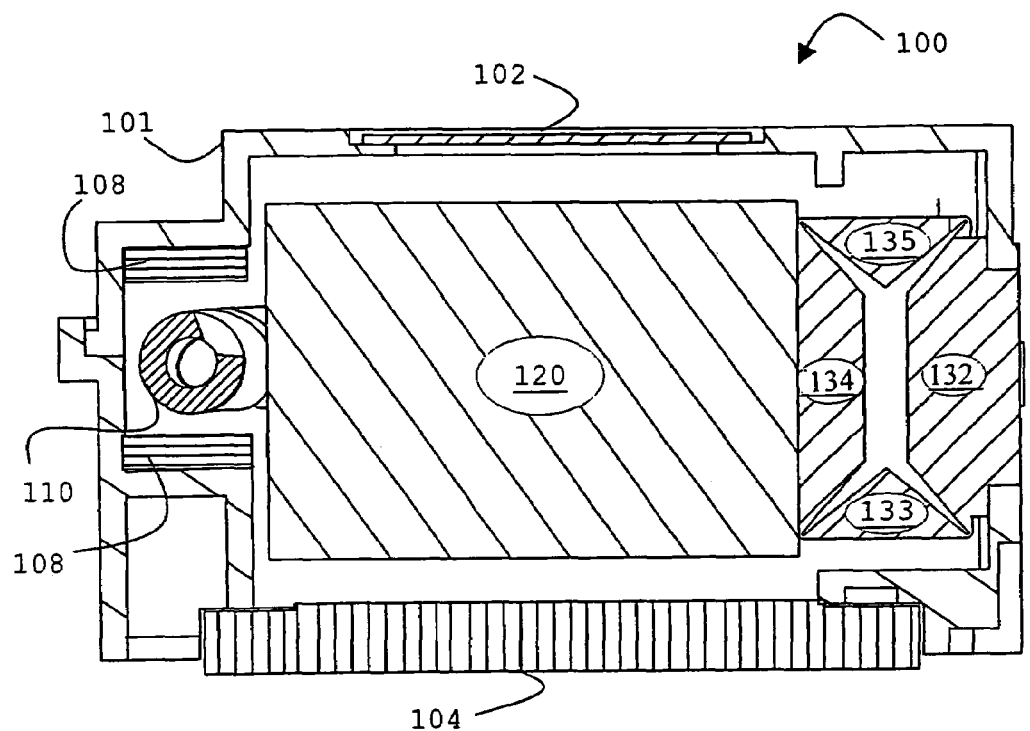
FIGS. 9A and 9B are perpendicular schematic cross-section of the camera housing of FIG. 8.
Figure 9B:
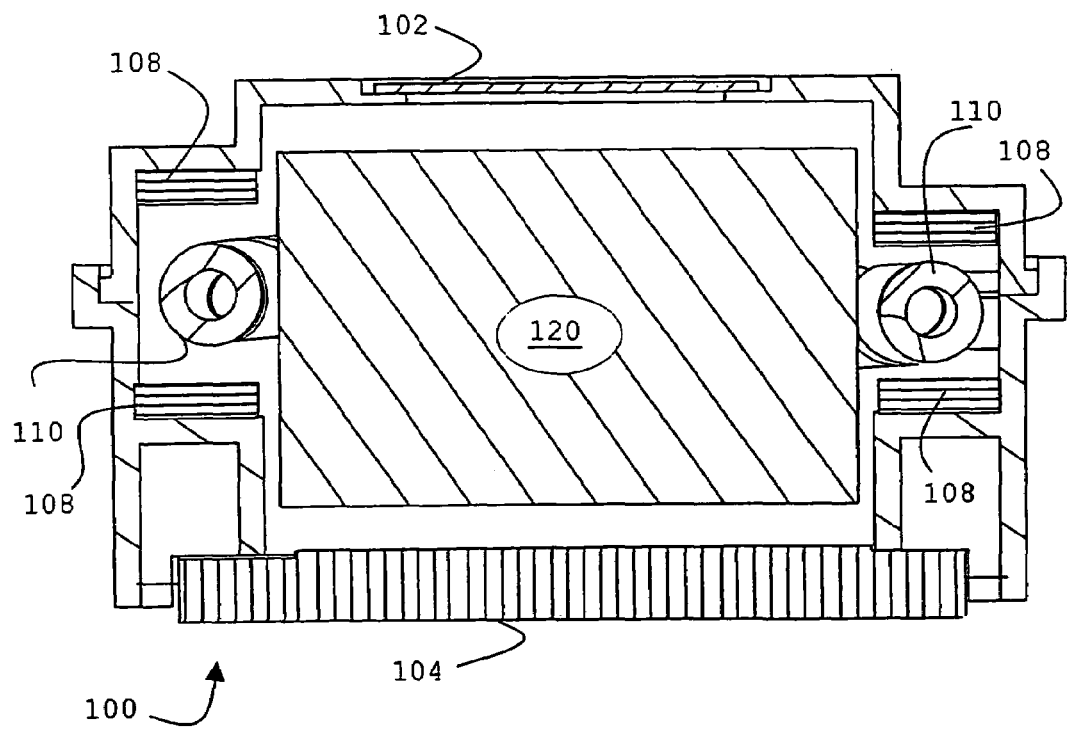

The camera assembly also has protective structures of the same type to those described in FIGS. 2 and 3, as shown in FIGS. 9A and 9B, in particular in the form of compliant polyurethane foam layers 108 glued to inner surfaces of the housing 100 around the actuator 110. In the manner described above with reference to FIGS. 2A and 2B, the layers 108 protect the actuator 110 from a sudden impact force, particularly if the force accelerates the actuator 110 in a direction that is not constrained by the suspension 130. In FIGS. 9A and 9B, this direction is the vertical direction in the paper plane. The distance between the actuator 110 in its inactive state, and the foam layers 108 increases towards the moving end of the actuator, so as not to interfere with the nominal displacement of the actuator during the normal operation of the camera.

We claim:

1. A housing in which there is mounted a ceramic actuator which is a bender extending in a helix around an axis which is curved, the housing including a protective structure comprising a continuous sloping ramp including a compliant portion facing the actuator and being arranged to limit the range of motion of the actuator by contacting a middle section of the actuator between fixed and moving terminals of the actuator.

2. A housing according to claim 1, wherein the sloping ramp is a rigid member, the compliant portion and the rigid member being formed together in the same moulding process.

3. A housing according to claim 1, wherein the protective structure is located outside a nominal range of displacement of the actuator.

4. A housing according to claim 1, wherein the protective structure is arranged to contact the actuator at points along a contour defined by the limits of the nominal range of displacement of the actuator.

5. A housing according to claim 1, further comprising a stop arranged to limit displacement of the moving terminal of the actuator.

6. A housing according to claim 1, further comprising a lens system actuated by the actuator.

7. A housing according to claim 1, wherein the compliant portion is a layer of compliant material.

8. A housing according to claim 7, wherein the layer of compliant material is a foam layer.

9. A housing according to claim 7, wherein the surface of the layer of compliant material facing the actuator has a convex shape.

10. A housing according to claim 1, wherein the compliant portion comprises a plurality of discrete resilient elements.

11. A housing according to claim 10, wherein the discrete resilient elements are mechanical spring structures.

12. A housing according to claim 1, wherein the protective structure comprises two said continuous sloping ramps arranged on opposite sides of the actuator.

* * * * *